United States Patent
Chao et al.

(10) Patent No.: US 11,455,454 B2
(45) Date of Patent: Sep. 27, 2022

(54) METHODS AND APPARATUSES FOR CONCURRENT COUPLING OF INTER-TIER CONNECTIONS

(71) Applicant: Arm Limited, Cambridge (GB)

(72) Inventors: Chien-Ju Chao, Austin, TX (US); Pranavi Chandupatla, Austin, TX (US); Saurabh Pijuskumar Sinha, Schertz, TX (US); Sheng-En Hung, Austin, TX (US); Xiaoqing Xu, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/103,251

(22) Filed: Nov. 24, 2020

(65) Prior Publication Data

US 2022/0164513 A1 May 26, 2022

(51) Int. Cl.
| | |
|---|---|
| *G06F 30/00* | (2020.01) |
| *G06F 30/394* | (2020.01) |
| *G06F 30/392* | (2020.01) |
| *H01L 25/065* | (2006.01) |
| *G06F 30/3947* | (2020.01) |

(52) U.S. Cl.
CPC .......... *G06F 30/394* (2020.01); *G06F 30/392* (2020.01); *G06F 30/3947* (2020.01); *H01L 25/0657* (2013.01); *H01L 2225/06527* (2013.01); *H01L 2225/06544* (2013.01)

(58) Field of Classification Search
CPC .. G06F 30/394; G06F 30/3947; G06F 30/392; H01L 25/0657; H01L 2225/06544; H01L 2225/06527
See application file for complete search history.

(56) References Cited

U.S. PATENT DOCUMENTS

| 6,202,191 B1 * | 3/2001 | Filippi ............. H01L 21/76858 257/522 |
| 7,240,314 B1 * | 7/2007 | Leung ..................... G06F 30/39 257/773 |
| 7,757,196 B2 * | 7/2010 | Bird ........................ H05K 1/113 716/125 |

(Continued)

OTHER PUBLICATIONS

Mirzaie; "Performance-Aware and Power-Efficient Three Dimensional (3D) Integrated Circuit (IC) Design Utilizing Evolutionary Algorithms"; Southern Methodist University; May 18, 2019; pp. 1-86.*

*Primary Examiner* — Naum Levin
(74) *Attorney, Agent, or Firm* — Pramudji Law Group PLLC; Ari Pramudji

(57) ABSTRACT

According to one implementation of the present disclosure, a method includes: generating a three-dimensional (3D) circuit design of an integrated circuit; and providing respective inter-tier connections coupling for first and second networks concurrently on the generated 3D circuit design. The first networks may include power or ground networks, while the second networks may include signal networks. In another implementation, a method includes: generating a three-dimensional (3D) circuit design of an integrated circuit; and providing inter-tier connections on the generated 3D circuit design during one of a placement stage, a partitioning stage, a clock tree synthesis (CTS) stage, or a routing stage of a physical circuit design procedure.

20 Claims, 14 Drawing Sheets

(56) References Cited

U.S. PATENT DOCUMENTS

| | | | | |
|---|---|---|---|---|
| 7,797,663 B2* | 9/2010 | Bird | ............... | H05K 1/181 |
| | | | | 716/137 |
| 8,916,910 B2* | 12/2014 | Geer | ............... | H01L 23/481 |
| | | | | 257/209 |
| 8,972,916 B1* | 3/2015 | Hsieh | ............... | G06F 30/3323 |
| | | | | 716/111 |
| 8,984,463 B2* | 3/2015 | Xie | ............... | G06F 1/32 |
| | | | | 716/120 |
| 9,032,353 B2* | 5/2015 | Tsai | ............... | G06F 30/392 |
| | | | | 716/119 |
| 9,098,666 B2* | 8/2015 | Samadi | ............... | G06F 1/32 |
| 9,177,940 B2* | 11/2015 | Lung | ............... | H01L 25/0657 |
| 9,330,215 B2* | 5/2016 | Tsai | ............... | G06F 30/30 |
| 9,577,640 B1* | 2/2017 | Park | ............... | H01L 23/5226 |
| 9,583,179 B2* | 2/2017 | Xie | ............... | H01L 23/481 |
| 9,741,691 B2* | 8/2017 | Lim | ............... | H01L 24/11 |
| 9,754,923 B1* | 9/2017 | Xie | ............... | H01L 24/13 |
| 9,773,754 B2* | 9/2017 | Fu | ............... | H01L 25/0657 |
| 9,929,149 B2* | 3/2018 | Sinha | ............... | H01L 23/528 |
| 10,121,743 B2* | 11/2018 | Kamal | ............... | H01L 27/0688 |
| 10,224,310 B2* | 3/2019 | Liu | ............... | G11C 8/12 |
| 10,607,938 B1* | 3/2020 | Rubin | ............... | H01L 27/1211 |
| 10,678,985 B2* | 6/2020 | Sinha | ............... | G06F 30/394 |
| 10,678,987 B2* | 6/2020 | Chen | ............... | G06F 30/39 |
| 10,950,599 B1* | 3/2021 | Or-Bach | ............... | G06F 1/20 |
| 10,997,346 B2* | 5/2021 | Thuries | ............... | G06F 30/392 |
| 2011/0291703 A1* | 12/2011 | Lee | ............... | H03K 19/096 |
| | | | | 326/93 |
| 2015/0112646 A1* | 4/2015 | Kamal | ............... | G06F 30/39 |
| | | | | 703/1 |
| 2015/0213178 A1* | 7/2015 | Lin | ............... | G06F 30/394 |
| | | | | 716/123 |
| 2018/0060475 A1* | 3/2018 | Sinha | ............... | G06F 30/392 |
| 2018/0259581 A1* | 9/2018 | Li | ............... | H01L 22/34 |

* cited by examiner

Top View of Power Grid

Cross-Sectional View of Power Grid

Top View of Power Grid

METHODS AND APPARATUSES FOR CONCURRENT COUPLING OF INTER-TIER CONNECTIONS

I. FIELD

The present disclosure is generally related to methods and apparatuses for concurrent coupling of inter-tier connections of an integrated circuit.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater efficiency in integrated circuit design.

For multi-tier/three-dimensional (3D) integrated circuits, one way to reduce voltage drop is by increasing the number of power supply sources (e.g., through the coupling of through-silicon vias (TSVs)) and inter-tier connections for power and ground. However, in doing so, the power and ground (PG) source density for TSVs may be restricted by various packaging design rules. In addition, such PG source density for inter-tier connections may also be restricted by the routing congestions for cross-tier connections. Consequently, the PG supply pairs may occupy significant routing resources that can adversely impact the performance, power, and area (PPA) of a 3D integrated circuit design. Accordingly, there is a need for more efficient solutions to prevent voltage drop across different tiers of a 3D integrated circuit.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 10A:
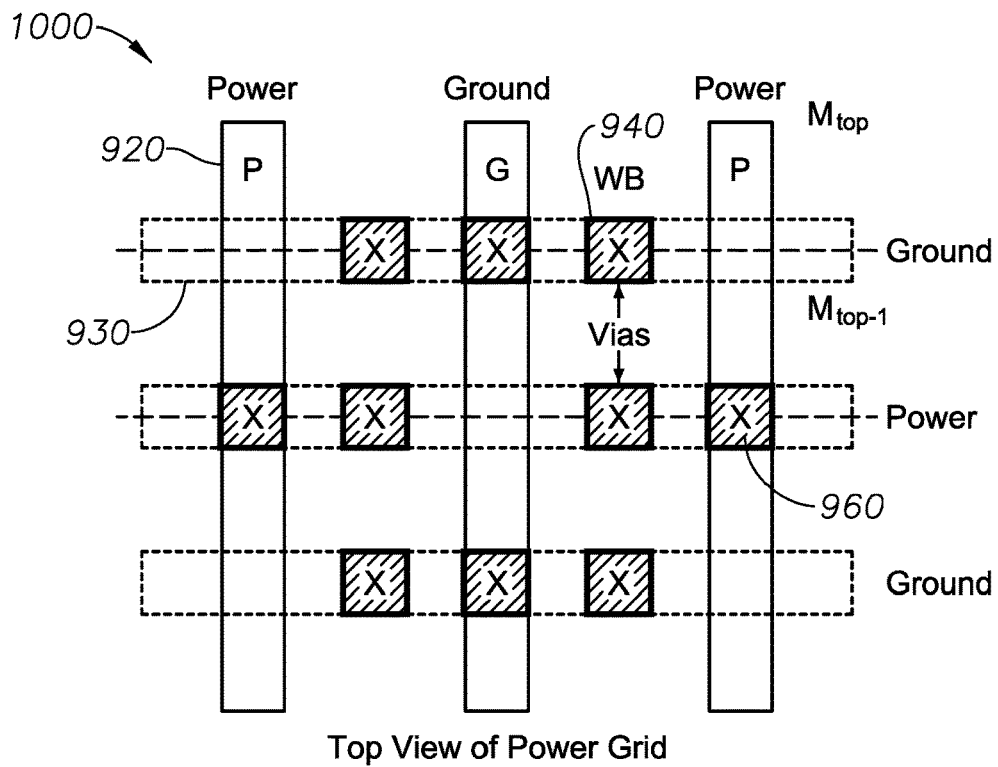

FIGS. 10A-10 B are top and cross-sectional views a portion of an example integrated circuit in accordance with various implementations described herein.

Figure 11:
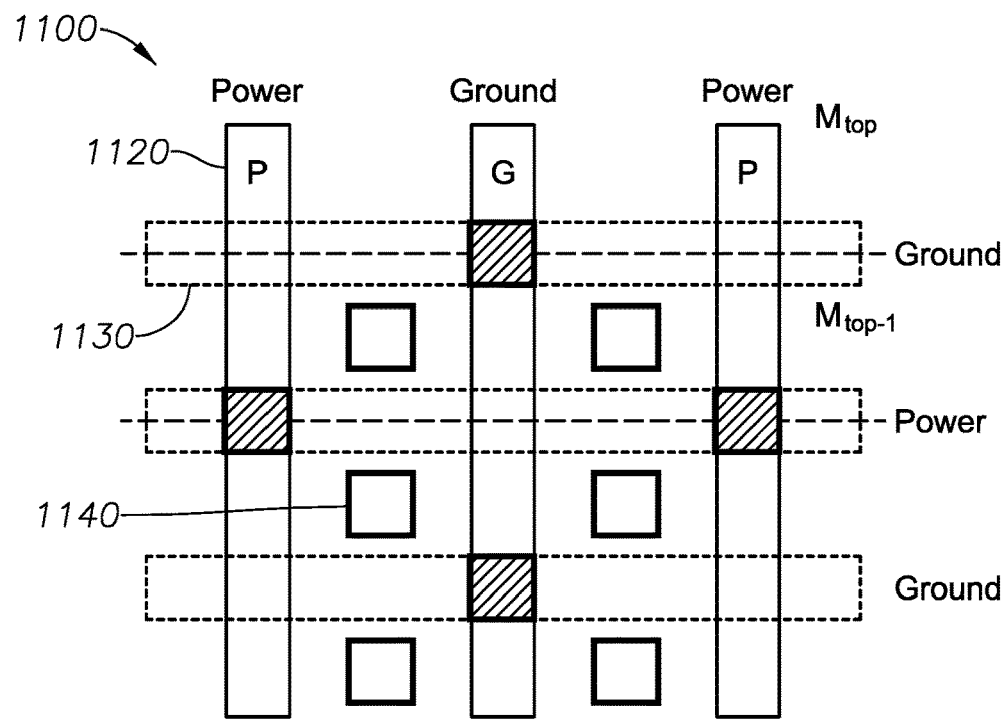

FIG. 11 is a schematic diagram of a portion of an example integrated circuit in accordance with various implementations described herein.

Figure 12:
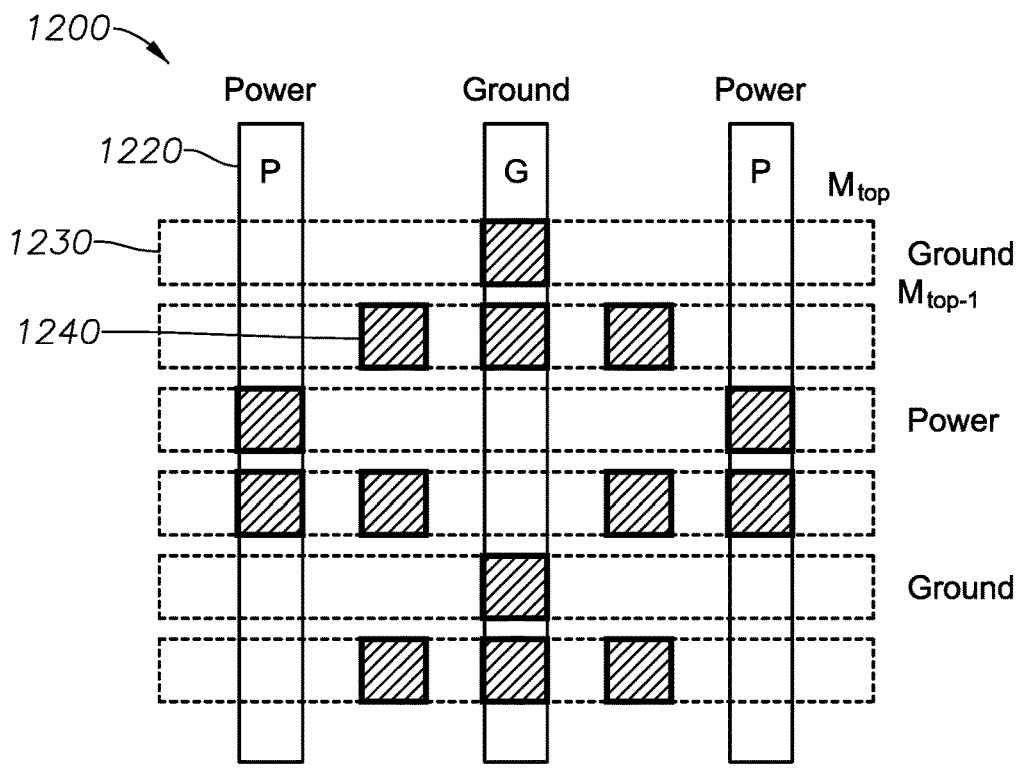

FIG. 12 is a schematic diagram of a portion of an example integrated circuit in accordance with various implementations described herein.

Figure 13:
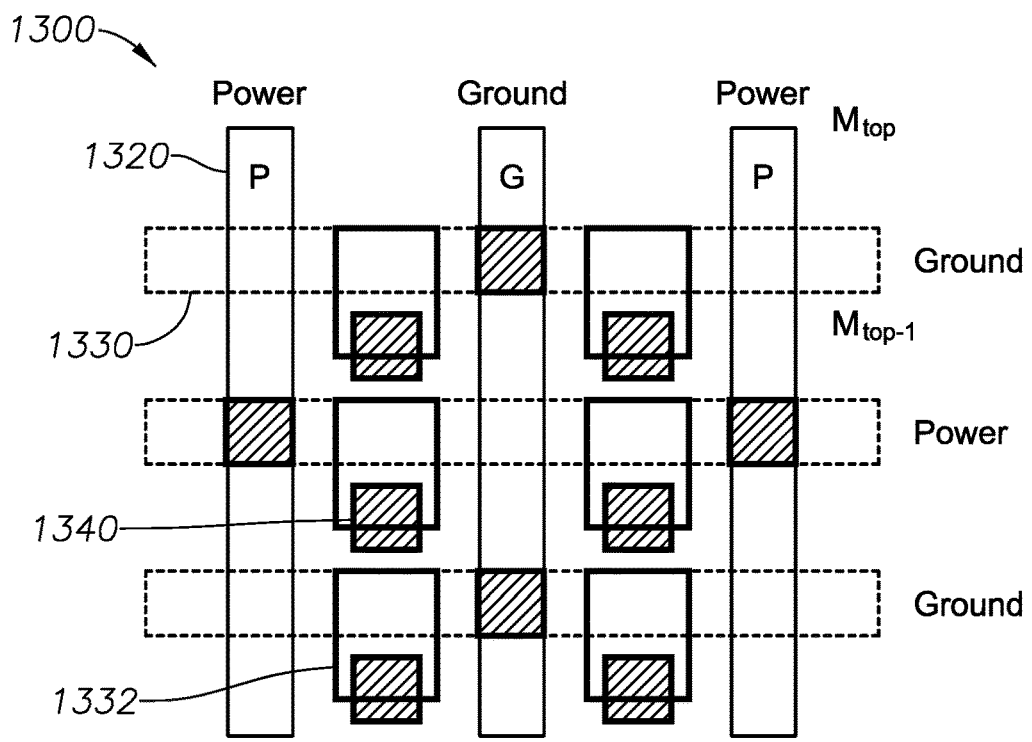

FIG. 13 is a schematic diagram of a portion of an example integrated circuit in accordance with various implementations described herein.

Figure 14:
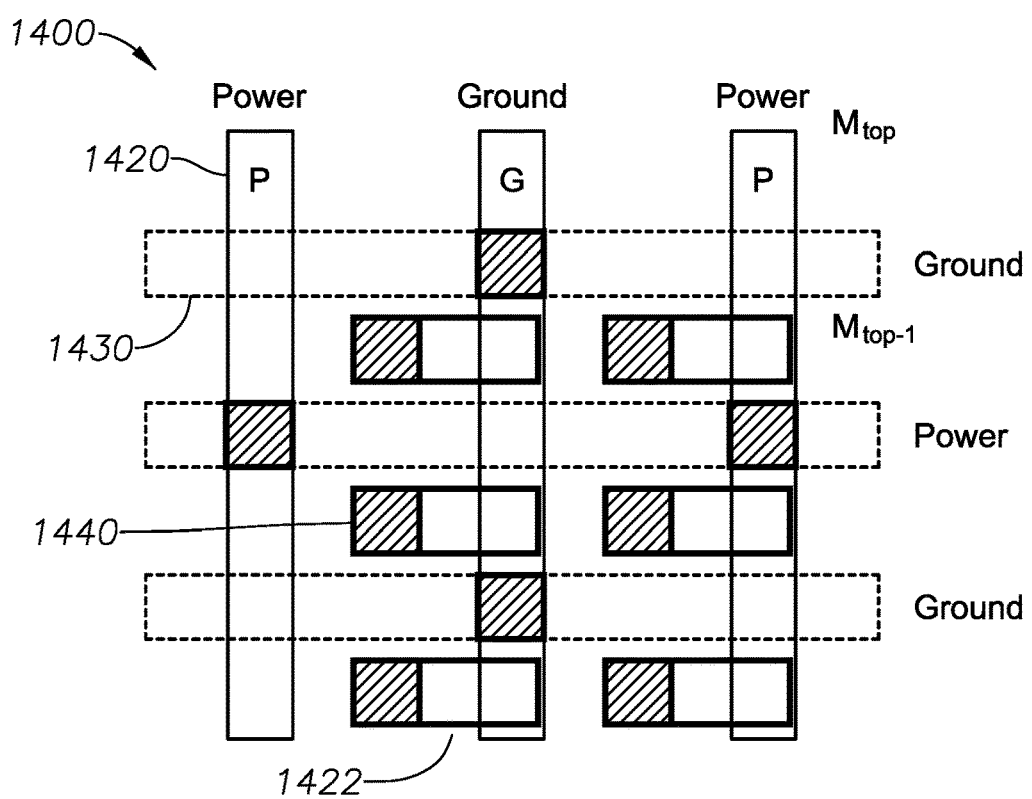

FIG. 14 is a schematic diagram of a portion of an example integrated circuit in accordance with various implementations described herein.

Figure 15:
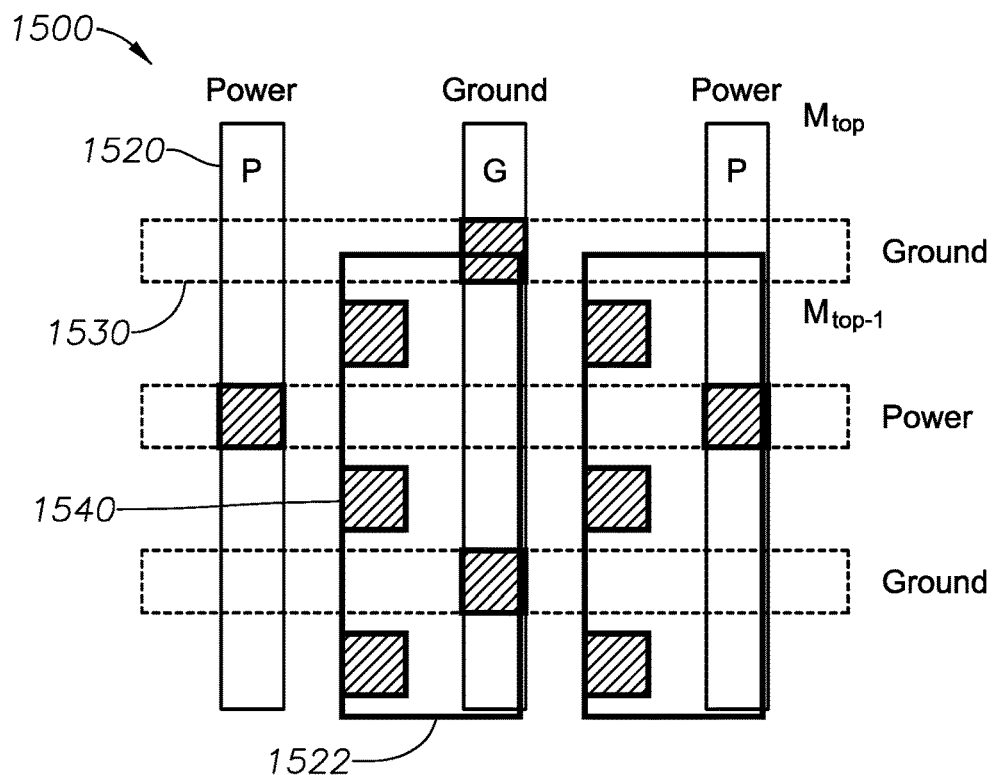

FIG. 15 is a schematic diagram of a portion of an example integrated circuit in accordance with various implementations described herein.

Figure 16:
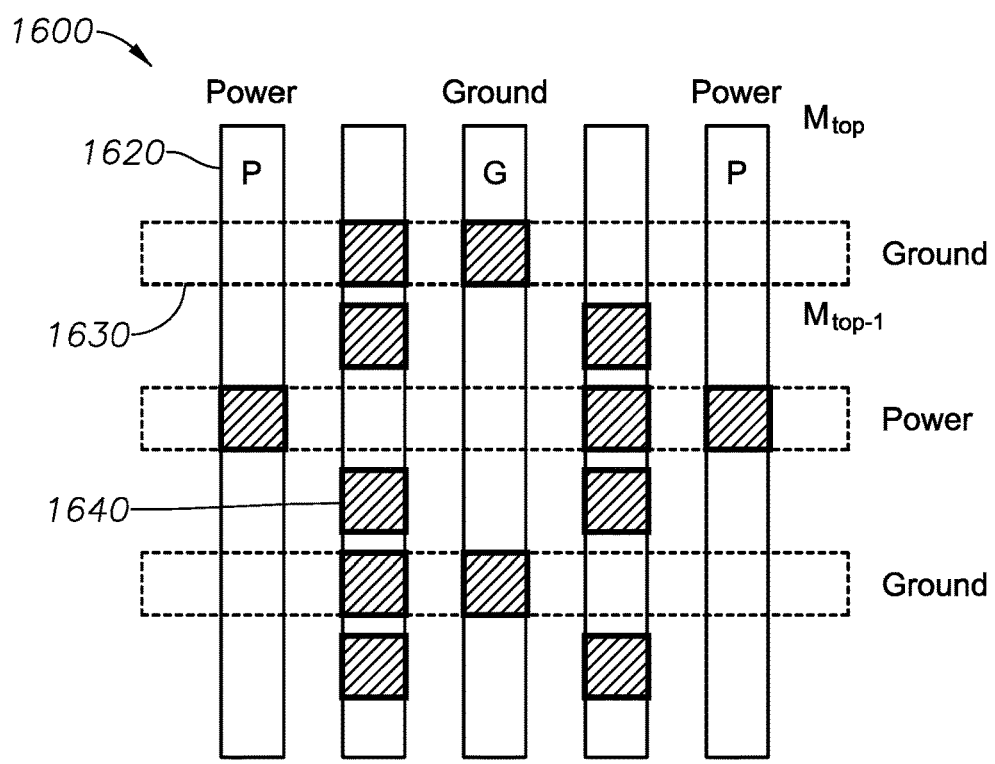

FIG. 16 is a schematic diagram of a portion of an example integrated circuit in accordance with various implementations described herein.

Figure 17:
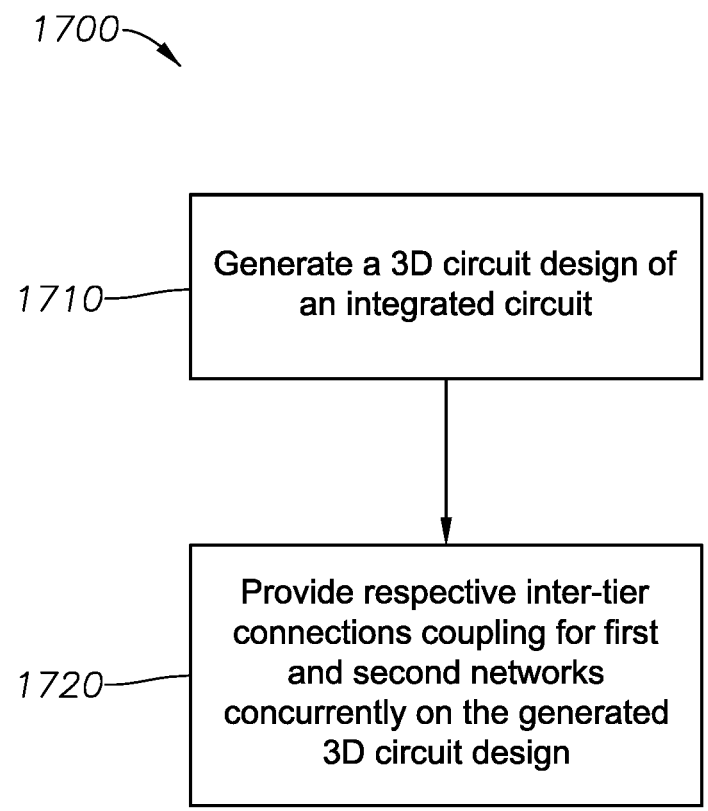

FIG. 17 is an operation method in accordance with various implementations described herein.

Figure 18:
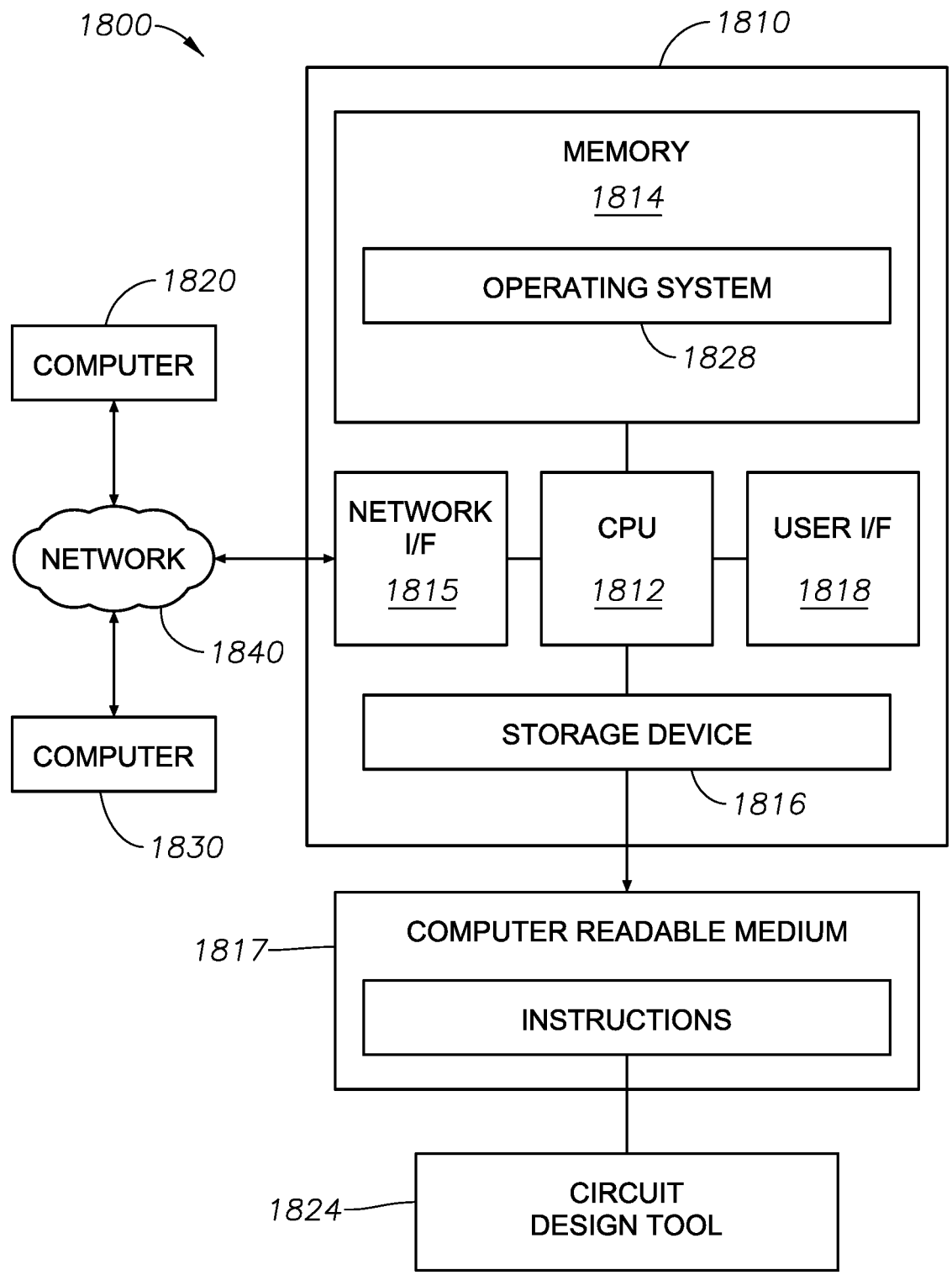

FIG. 18 is a block diagram in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, a method includes: generating a three-dimensional (3D) circuit design of an integrated circuit (i.e., standard cell placement stage, "a standard" semiconductor die design; a memory macro design; a floorplan stage of 3D-IC design, one (local) or more power grid design across multiple tiers); and providing respective inter-tier connections (e.g., wafer bonds (WB)) coupling (i.e., 3D inter-tier connection couplings/assignment) for first and second networks (i.e., power/ground and signal nets) concurrently on the generated 3D circuit design.

According to one implementation of the present disclosure, an apparatus includes: a computer-readable storage medium; at least one processor; and program code stored on the computer-readable storage medium and configured upon execution by the at least one processor to: generate a three-dimensional circuit design of an integrated circuit; and provide respective inter-tier connections coupling for first and second networks concurrently on the generated 3D circuit design.

According to one implementation of the present disclosure, a method includes: generating a three-dimensional (3D) circuit design of an integrated circuit; and providing inter-tier connections on the generated 3D circuit design during one of a placement stage, a partitioning stage, a clock tree synthesis (CTS) stage, or a routing stage of a physical circuit design procedure.

Inventive aspects of the present invention allow for the improvement of voltage drop of three-dimensional integrated circuit (3D IC) designs or multi-die configurations. Advantageously, the inventive scheme and techniques provide concurrent coupling of inter-tier connections for both power and ground (PG) networks and for signal networks on the multi-tier integrated circuit.

Advantageously, in certain aspects, based on a predetermined Power Distribution Network (PDN), inter-tier connections may be pre-assigned (i.e., pre-coupled) to power or ground networks (i.e., PG nets) in proximity to or adjoined to "power-hungry" design blocks. In addition, spare (i.e., unassigned, unused) inter-tier connections may be post-assigned (i.e., post-coupled, after cross-tier signal network routing based on implementation of local power grids and inter-connection grids. Favorably, as all the spare inter-tier connections may be coupled to the PG nets, voltage drop improvement would be realized with incurring a signal routing penalty.

In certain schemes and techniques, as described herein, the inventive methods and apparatuses support memory compilers (e.g., compiler graphical user interfaces (GUI)) to generate 3D IC memory instances utilizing concurrent coupling of inter-tier connections for PG networks and signal networks. Advantageously, such schemes and techniques provide an improvement in the underlying computer technology of memory compilers.

Figure 1:
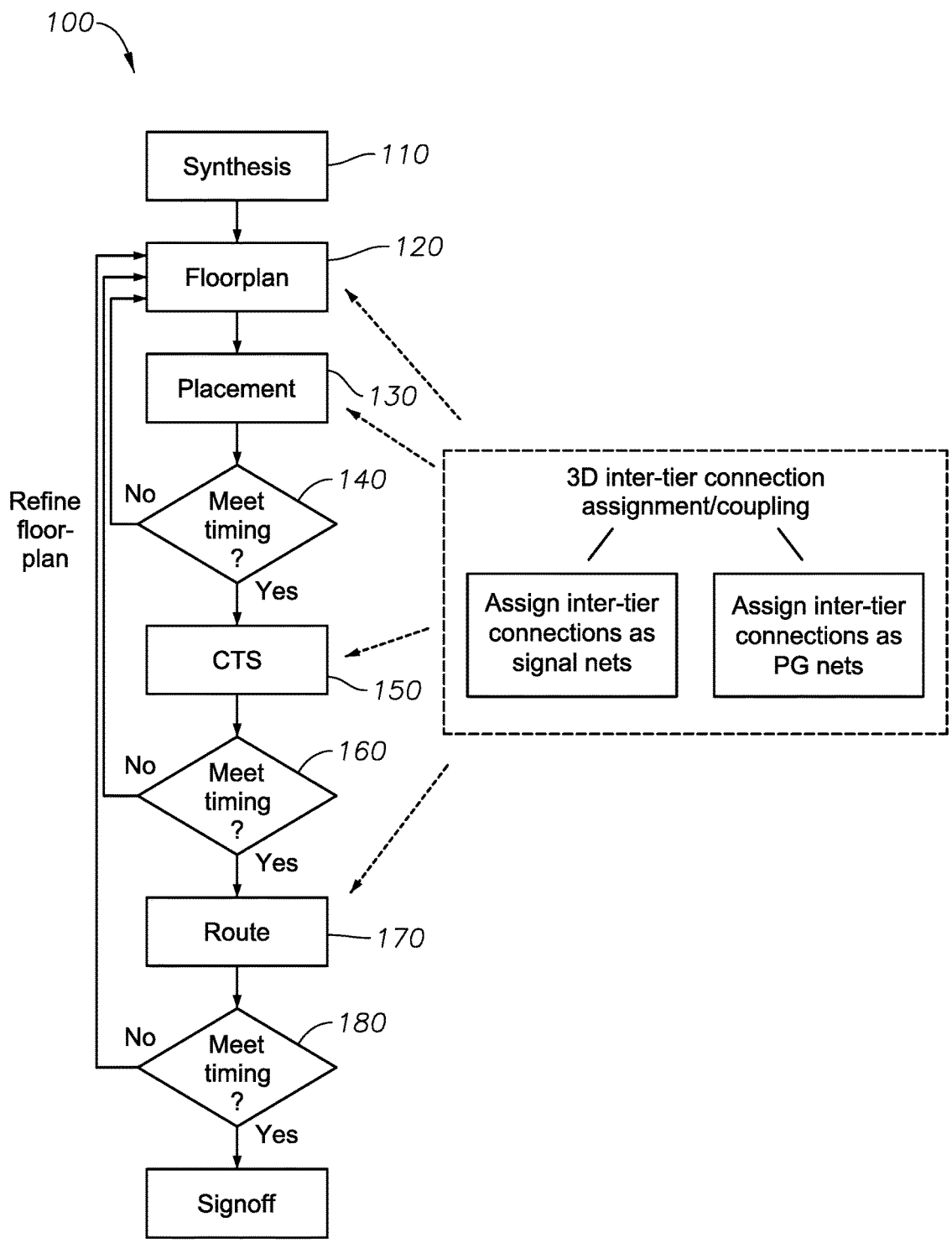
FIG. 1 is an operational flowchart in accordance with various implementations described herein.

Referring to FIG. 1, an example methodology 100 (i.e., a digital operation, a digital routine) for simultaneous coupling of inter-tier connections between locations on an integrated circuit (i.e., a three-dimensional integrated circuit) and to either one of power and ground networks and signal networks is shown. In certain implementations, inter-tier connections comprise a plurality of connections on a predefined grid (i.e., inter-tier connection grid) of connections per respective tier of a 3D integrated circuit design.

In Step 110 of the methodology, the first stage includes the synthesis of the circuit design. In Step 120, the second stage includes the initial floor plan of the 3D integrated circuit design. In Step 130, the third stage includes the placement of various circuit design blocks, local power grids, and inter-tier connect grids. In Step 140, a decision may be made whether a first predefined timing threshold has been satisfied. If no, the methodology reverts back to Step 120. If yes, the methodology proceeds to Step 150 where a clock-tree synthesis (CTS) may be conducted. Next, at Step 160, a decision may be made whether a second predefined timing threshold has been satisfied. If no, the methodology reverts back to Step 120. If yes, the methodology proceeds to Step 170 where routing of the circuit design may be performed. At Step 180, a decision may be made whether a third timing threshold has been satisfied. If no, the methodology reverts back to Step 120. If yes, the methodology proceeds to Step 180 where the routine would. Correspondingly, each of the decision stages (e.g., Steps 140, 160, 180) would allow for refinement of the floor plan.

In current operations, each of certain sub-steps in order including: 1) TSV and inter-tier connections array generation, 2) creation of TSV and inter-tier connection pairings (i.e., couplings) for power and ground networks (e.g., assignment of TSVs for power and ground networks, assignment of inter-connections for power and ground), 3) connection of TSV and inter-tier connection pairs (e.g., creation of stack vias between TSV and inter-tier connections), 4) creation of a local power grid, and 5) connection of the local power grid (e.g., connection of TSV and inter-tier connection pairs to local power mesh) are performed solely at the Step 120 during the floorplan design stage.

Advantageously, in contrast, according to the inventive aspects, three-dimensional (3D) inter-tier connections coupling (i.e., providing three-dimensional (3D) inter-tier connection assignments) may be provided concurrently between a 3D circuit design (i.e., a generated 3D circuit design) (e.g., a locations of the circuit design) and signal networks (i.e., "signal nets") and power or ground networks (i.e., "PG nets"). Moreover, as another advantage, as illustrated in FIG. 1, such concurrent coupling (i.e., inter-tier connecting) may be performed at any of the floorplan stage (Step 120), the placement stage (Step 130), the CTS stage (Step 150), and the routing stage (Step 170). In doing so, greater flexibility and design efficiency may be realized.

Figure 2:
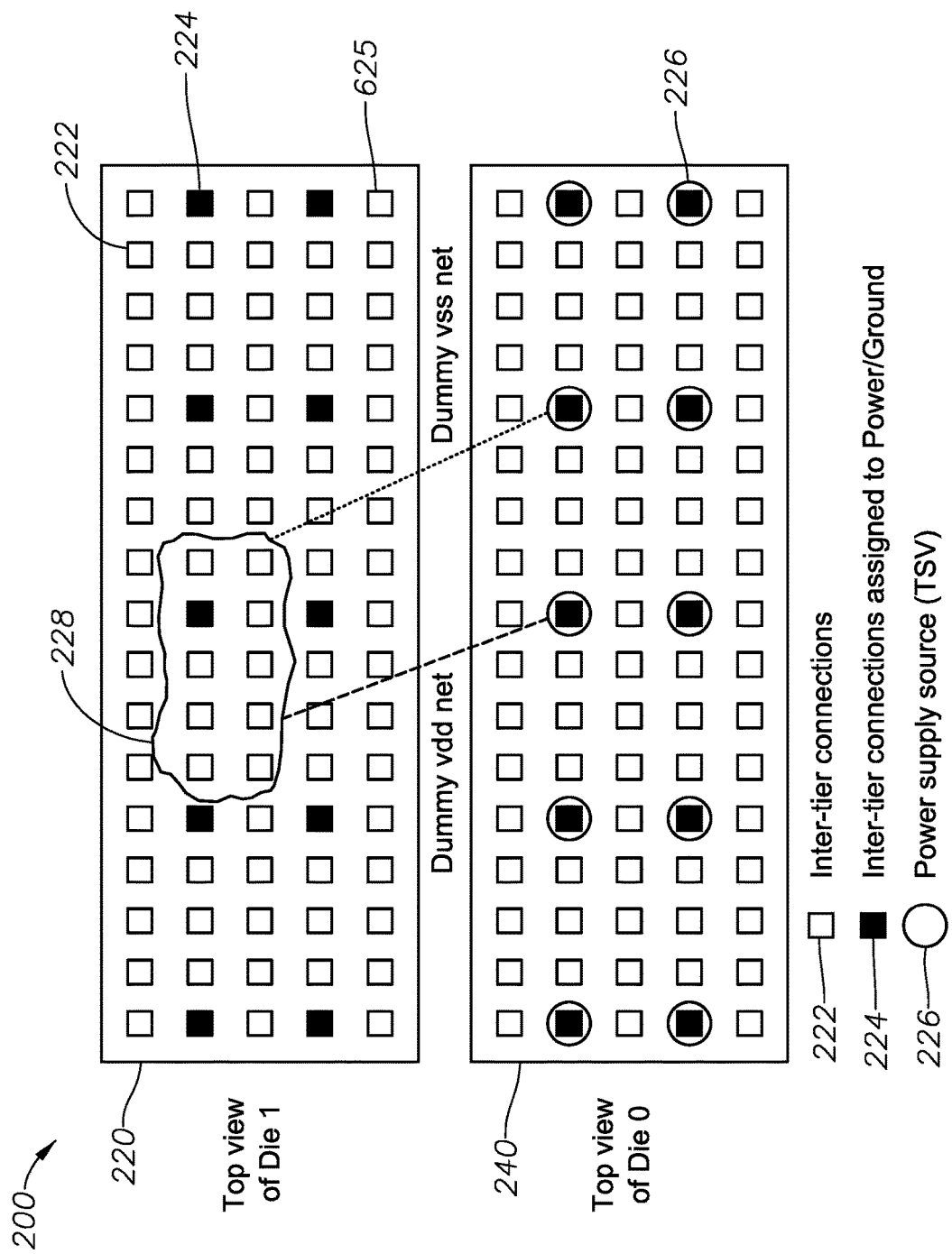
FIG. 2 is a schematic diagram of a portion of an example integrated circuit in accordance with various implementations described herein.

Referring to FIG. 2, an example diagram of an integrated circuit 200 (e.g., a system-on-chip (SoC), multi-tier semiconductor dies, multiple layers of a 3D IC) is shown. As illustrated, the integrated circuit 200 may include at least a first die 220 (e.g., top-view of first die is shown) and a second die 240 (e.g., top-view of second die is shown), where place-holder (i.e., simulated, "dummy") power (i.e., VDD) and ground (i.e., VSS) networks are connected between the first and second dies 220, 240. Also depicted are various uncoupled (i.e., unassigned) inter-tier connections 222 (shown as unfilled squares), coupled (i.e., assigned) inter-tier connections 224 (shown as filled squares), power supply sources 226 (e.g., connections to TSVs, connections to power or ground nets) (shown as unfilled circles). In a particular implementation, an example design block 228 is shown on the first die 220 and encompasses various uncoupled and coupled inter-tier connections 222, 224. In certain implementations, utilizing inter-tier connections (e.g., coupled inter-tier connections 224), locations on the design block 220 (on a first die 220) may be adjoined to the power supply sources 226 (coupled to the second die 240).

Figure 3:
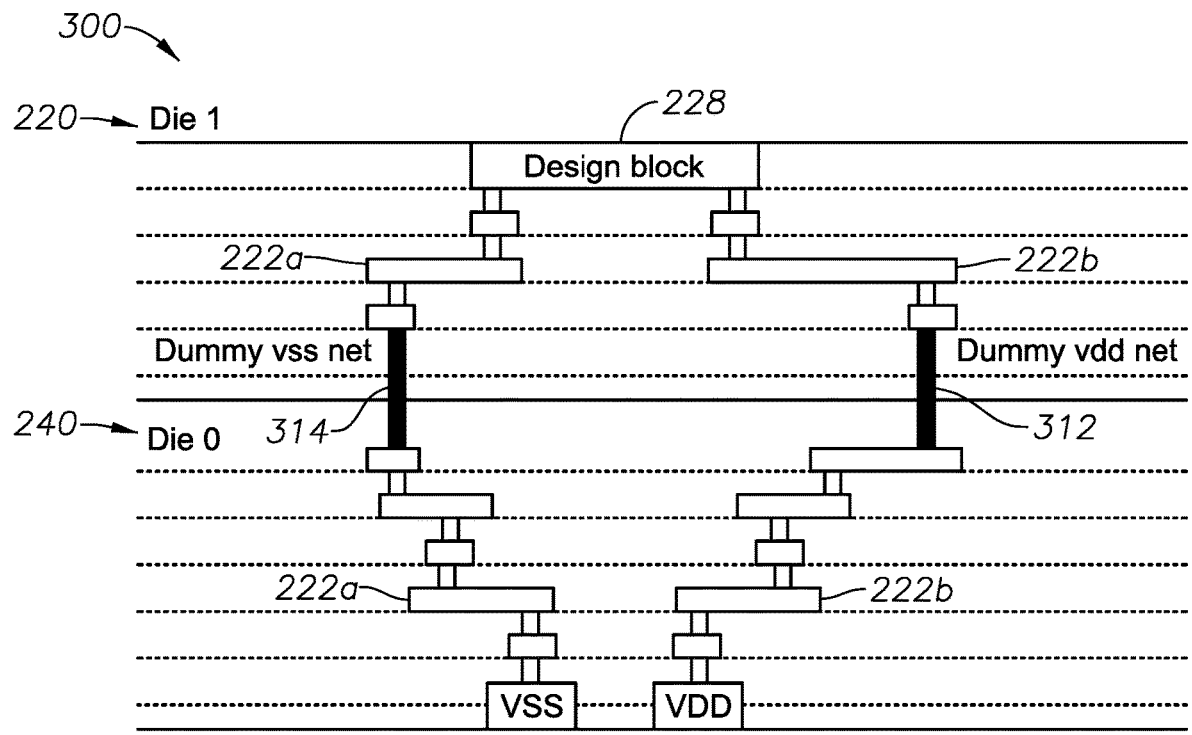
FIG. 3 is a schematic diagram of a portion of an example integrated circuit in accordance with various implementations described herein.

Referring to FIG. 3, an example diagram 300 representing the integrated circuit 200 of FIG. 2 is shown. As illustrated, the diagram 300 may include at least a first die 220 and a second die 240, where the example design block 228 is electrically connected to the place-holder power 312 (e.g., VDD) and ground 314 (e.g., VSS) networks (nets) between the first and second dies 220, 240. In an example implementation, as described with reference to FIGS. 3-7, routing (shown as shaded blocks) 222 (222a, 22b) and inter-tier connections coupling (i.e., assignment, coupled inter-tier connections 224) may be conducted concurrently for placeholder ("dummy") power 312 or ground nets 314 (i.e., corresponding to power supply sources 226 of FIG. 2) and signal nets (inter-tier connections coupling for signal nets 625 shown in FIG. 6).

Figure 4:
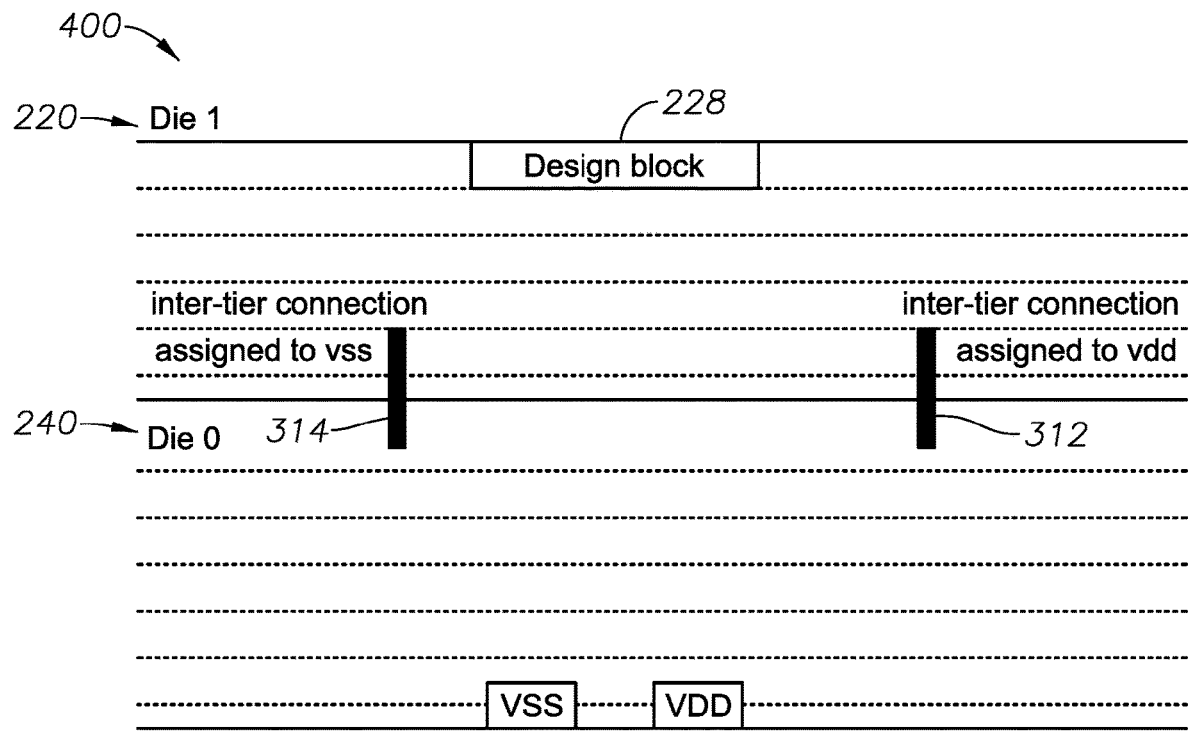
FIG. 4 is a schematic diagram of a portion of an example integrated circuit in accordance with various implementations described herein.
Figure 5:
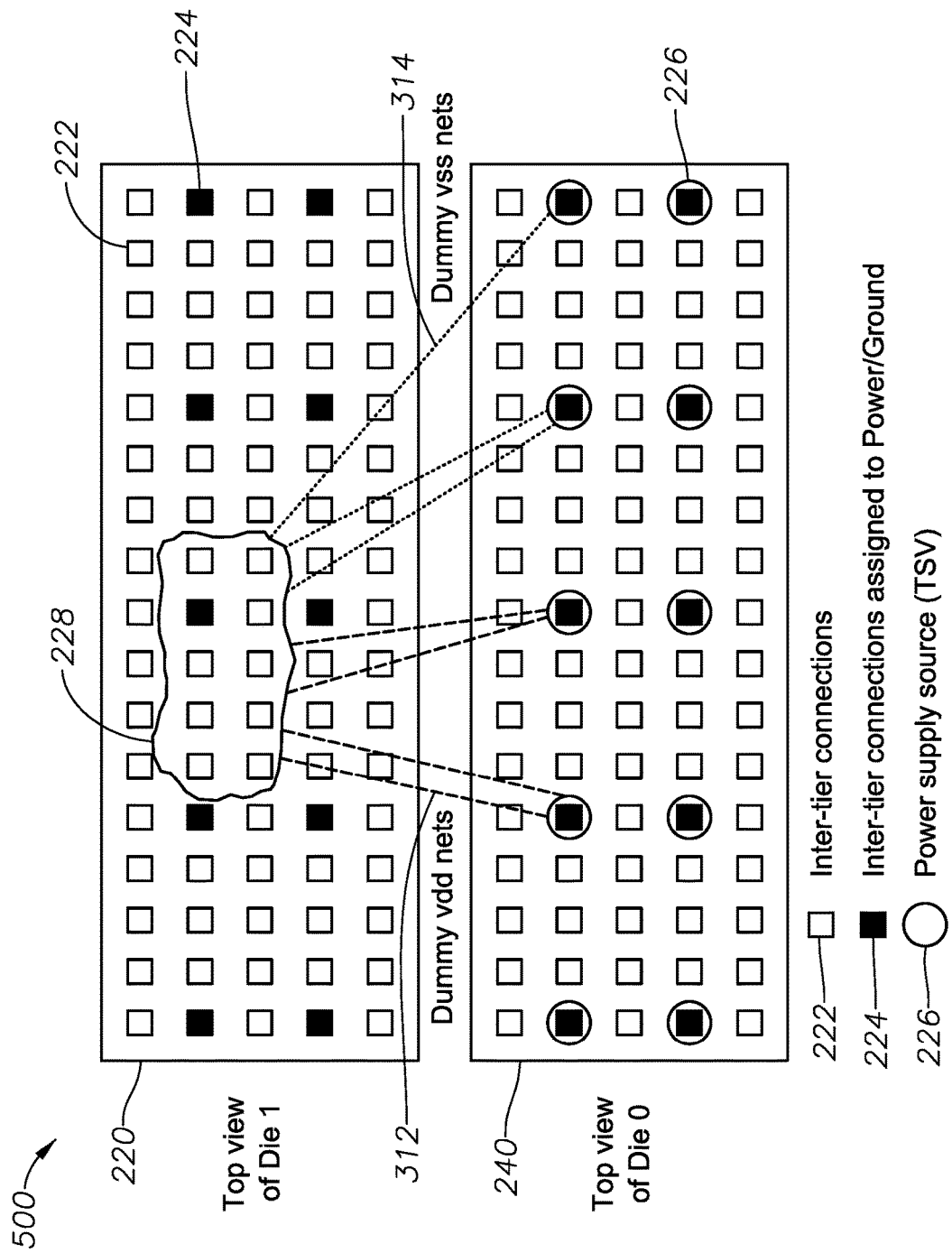
FIG. 5 is a schematic diagram of a portion of an example integrated circuit in accordance with various implementations described herein.

Referring to FIGS. 4 and 5, example diagrams 400, 500 representing the integrated circuit 200 of FIG. 2 is shown. As illustrated, in one implementation of a step of the inventive methodology, the routing patterns 222a, 222b (for the coupling from the design block 228 to the power and ground nets 312, 314) may be removed (as shown in FIG. 4) leaving the place-holder power and ground nets 312 and 314 to remain. Subsequently, as shown in FIG. 5, such example place-holder power and ground nets 312, 314 may be added to the integrated circuit design based on extracted characteristics (i.e., one or more metrics) of the example design block 228 including, but not limited to, power consumption, electrical potential difference (i.e., voltage drop), timing criticality of cross-tier networks, or utilization rate. In certain implementations, the quantity and locations of the provided place-holder first networks (i.e., power and ground nets) are based on the one or more metrics. In addition, one or more priorities of the place-holder first networks ("dummy PG nets) and second networks (i.e., signal nets) are based on the one or more metrics. In certain cases, the one or more priorities correspond to an assigned "cost" of the first and second networks coupling to the inter-tier connections.

Figure 6:
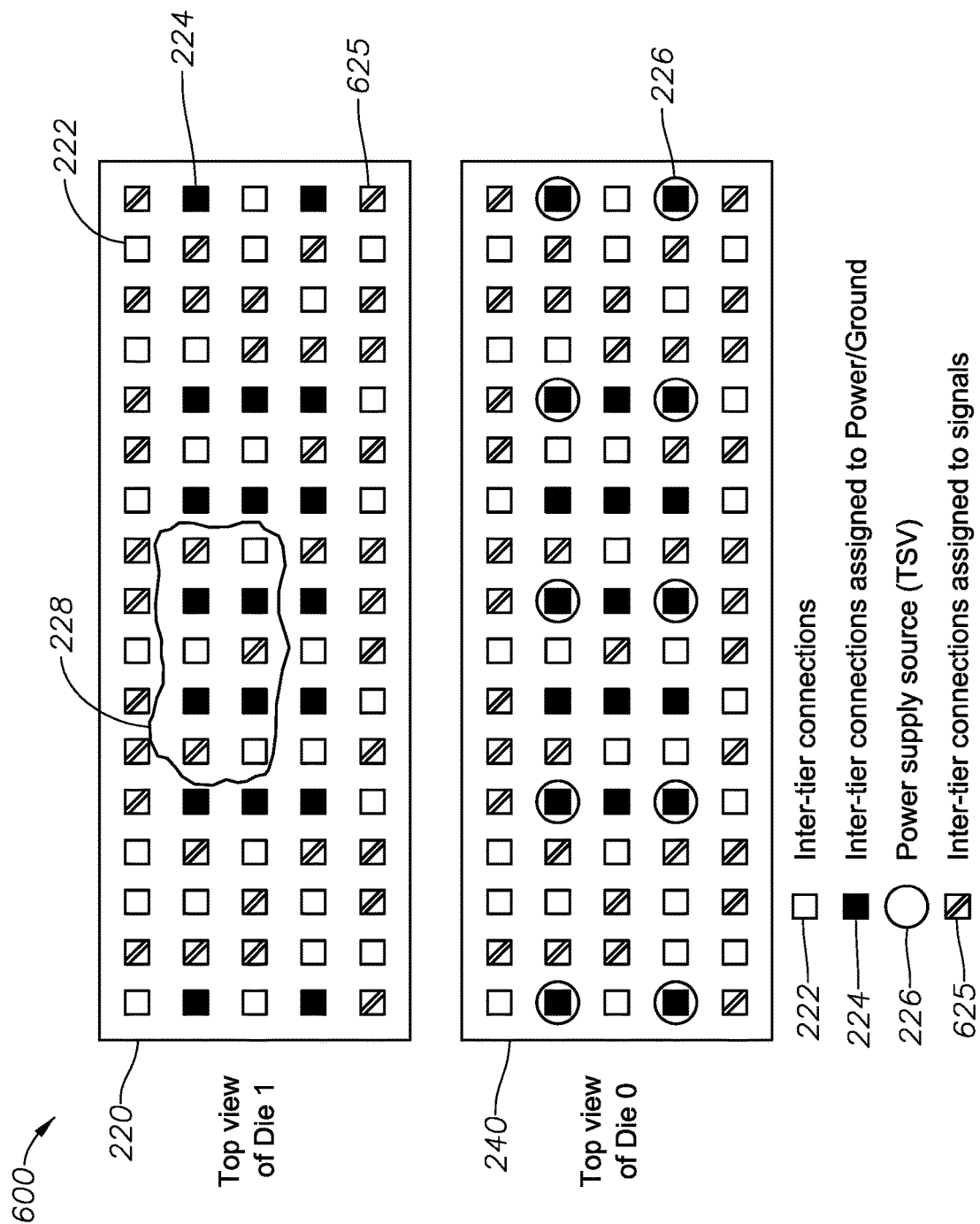
FIG. 6 is a schematic diagram of a portion of an example integrated circuit in accordance with various implementations described herein.

Referring to FIG. 6, an example diagram 600 representing the integrated circuit 200 of FIG. 2 is shown. As illustrated in FIG. 6, the integrated circuit 600 may include at least a first die 220 and a second die 240. Also depicted are: various uncoupled (i.e., unassigned) inter-tier connections 222 (shown as unfilled squares); coupled (i.e., assigned) inter-tier connections 224 (shown as filled squares) to power (i.e., VDD) or ground (i.e., VSS); coupled (i.e., assigned) inter-tier connections 625 (shown as cross-shaded squares) to signal networks; power supply sources 226 (e.g., connections to TSVs, connections to power or ground nets) (shown as unfilled circles). In a particular implementation, an example design block 228 is shown on the first die 220 and encompasses various uncoupled and coupled inter-tier connections 222, 224, 625. In one implementation, in a step of the inventive methodology, after reserving inter-tier connections 224 for power or ground networks (i.e., PG nets), signal networks (i.e., signal nets) may be assigned/coupled (i.e., providing inter-tier connections 625 for the signal nets, routing of signal networks multiple tiers of the integrated circuit 200).

Figure 7:
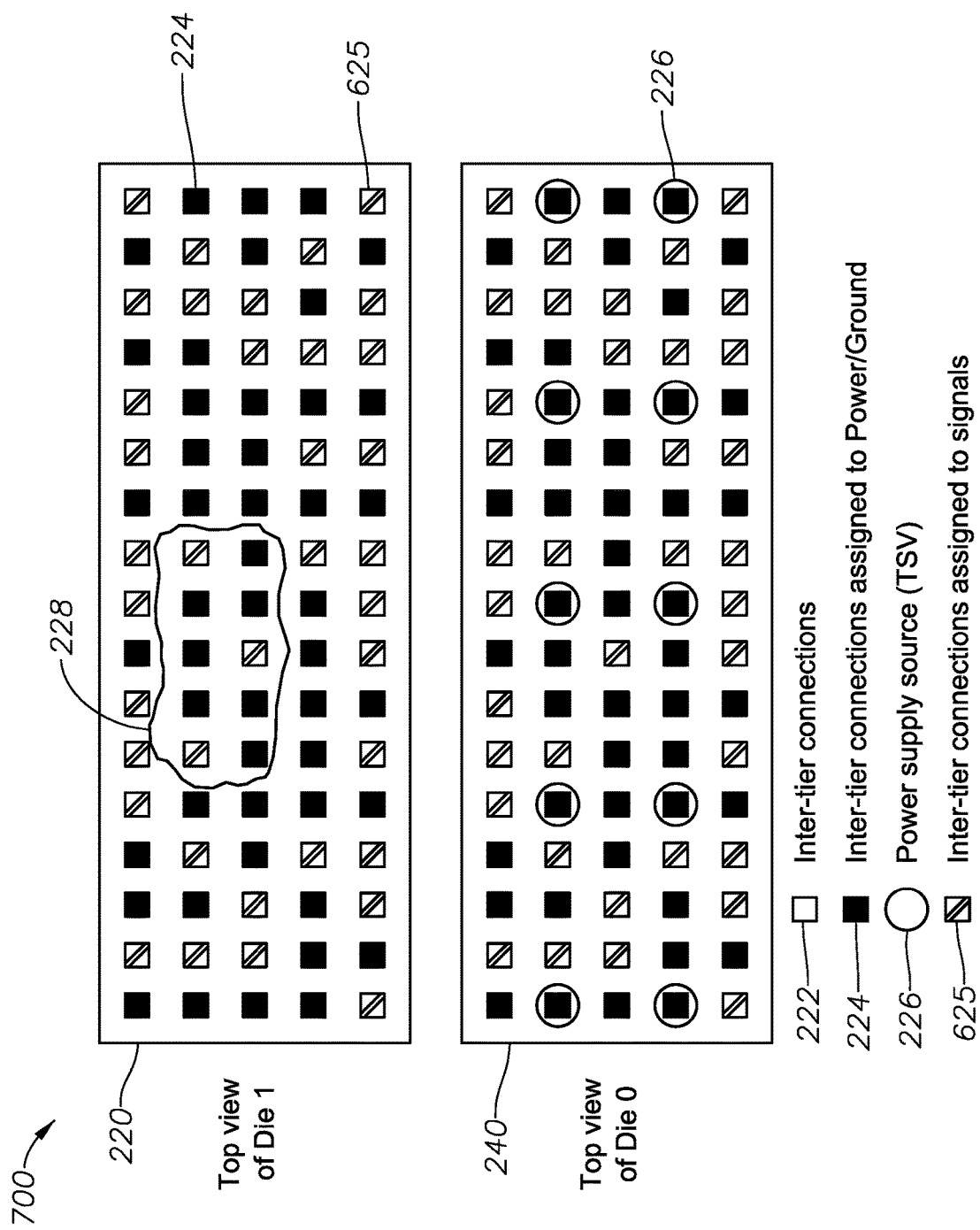
FIG. 7 is a schematic diagram of a portion of an example integrated circuit in accordance with various implementations described herein.

Referring to FIG. 7, an example diagram 700 representing the integrated circuit 200 of FIG. 2 is shown. As illustrated in FIG. 7, the integrated circuit 700 may include at least a first die 220 and a second die 240. Also depicted are: coupled (i.e., assigned) inter-tier connections 224 (shown as filled squares) to power (i.e., VDD) or ground (i.e., VSS); coupled (i.e., assigned) inter-tier connections 625 (shown as cross-lined squares) to signal networks; power supply sources 226 (e.g., connections to TSVs, connections to power or ground nets) (shown as unfilled circles). In a particular implementation, an example design block 228 is shown on the first die 220 and encompasses coupled inter-tier connections 724 and 725. In one implementation, in a step of the inventive methodology, after signal networks (signal nets) may be assigned/coupled (i.e., providing inter-tier connections for the signal nets 625), all of the unused (i.e., un-assigned, spare) inter-tier connections 222 may be coupled to the PG nets (i.e., proving inter-tier connections 224 for the PG nets), post-assigning all of the spare (i.e., un-assigned) inter-tier connections to PG nets across different tiers to obtain the maximum amount power/ground connections for the integrated circuit. In certain cases, the un-assigned inter-tier connections may be identified based on the respective inter-tier connections coupled to the first networks (i.e., PG nets) and second networks (i.e., signal nets). For instance, such identification corresponds to the implementation of the inventive methodologies on the local power grids and the inter-tier connection grids of the integrated circuit.

Figure 8:
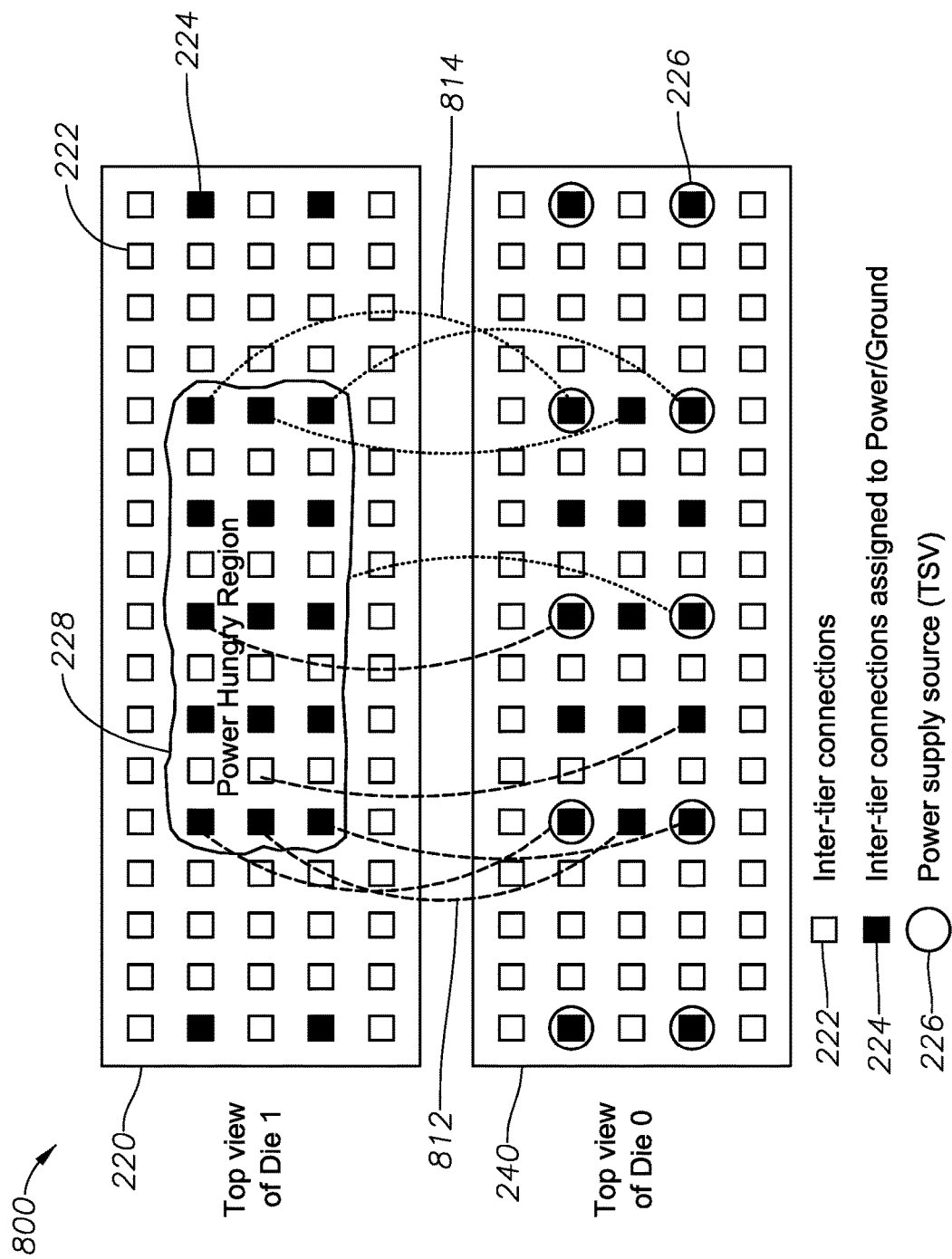
FIG. 8 is a schematic diagram of a portion of an example integrated circuit in accordance with various implementations described herein.

Referring to FIG. 8, an example diagram 800 of the integrated circuit 200 (e.g., a system-on-chip (SoC), multi-tier semiconductor dies, multiple layers of a 3D IC) is shown. As illustrated, the integrated circuit 200 may include at least a first die 220 (e.g., top-view of first die is shown) and a second die 240 (e.g., top-view of second die is shown), where place-holder (i.e., "dummy") power (i.e., VDD) and ground (i.e., VSS) networks are connected between the first and second dies 220, 240. Also depicted are various uncoupled (i.e., unassigned) inter-tier connections 222 (shown as unfilled squares), coupled (i.e., assigned) inter-tier connections 224 (shown as filled squares), power supply sources 226 (e.g., connections to TSVs, connections to power or ground nets) (shown as unfilled circles). Advantageously, as illustrated in FIG. 8, in a power-hungry region 228, a greater density (e.g., 1 of every 2 inter-tier connections in the horizontal direction) of inter-tier connections 224 may be coupled to the PG nets 812, 814 (for coupling to the power supply source).

In one particular implementation, if after a standard cell placement, a "power hungry" module (e.g., as a design block) is identified (i.e., above a predetermined power utilization threshold) on an example first die 220, a set of inter-tier connections 224 may be pre-assigned around the power hungry region 228 to the PG nets 812, 814 by coupling a greater number of inter-tier connections (i.e., to provide for higher density of inter-tier connections) to the power grid of the first die 220. In doing so, the power-hungry region 228 of the first die 220 would have access to more power tapping points of the second die 240. Advantageously, such a procedure would further reduce voltage drop issues across both the tiers of the first and second dies 220, 240. As illustrated in FIG. 8, in one example of providing a greater density of inter-tier connections, the assignment and coupling may be for 1 out of every 2 inter-tier connections to the PG nets 812, 814 for the power-hungry region 228, while for other regions, 1 out every 4 inter-tier connections may be assigned and coupled to the PG nets 812, 814. Furthermore, the remaining inter-tier connections may be utilized for signal network connections as part of the routing stage.

Consequently, such above-described methodologies may rely on existing TSVs that already have an optimal power distribution network (PDN) mesh for the coupling of PG sources (e.g., TSVs) via inter-tier connections. However, such optimal PDN meshes may not always be available. Hence, various layout design techniques may be utilized to enable wire connectivity between local power grids (on different tiers of the integrated circuit) and the inter-tier connections.

Figure 9A:
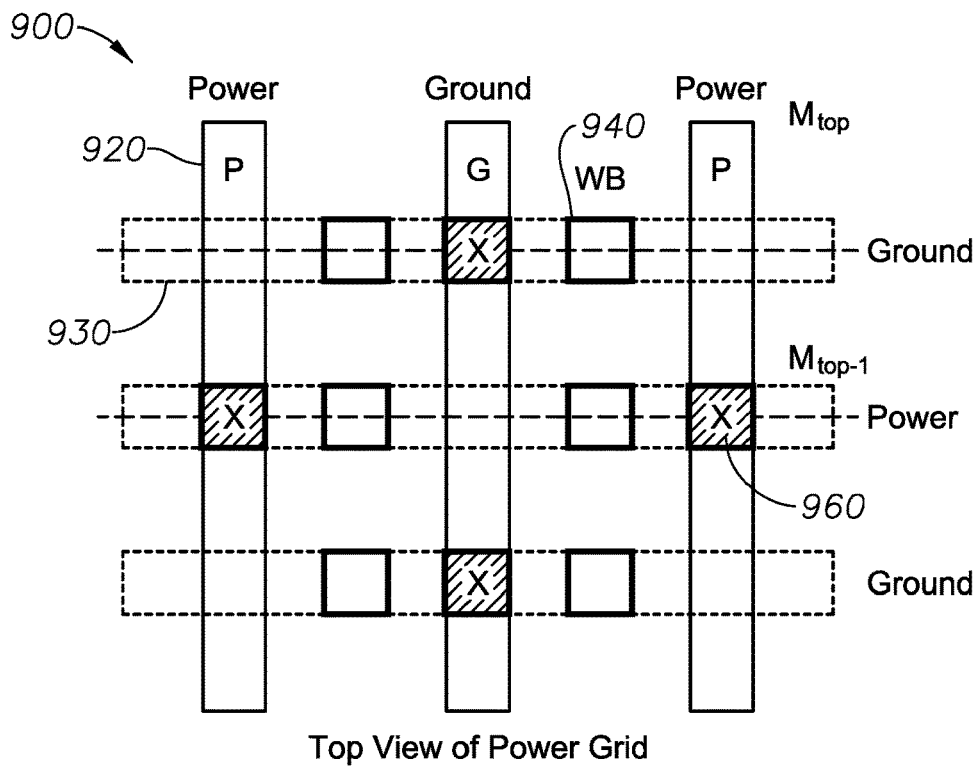
FIGS. 9A-9B are top and cross-sectional views of a portion of an example integrated circuit in accordance with various implementations described herein.
Figure 9B:
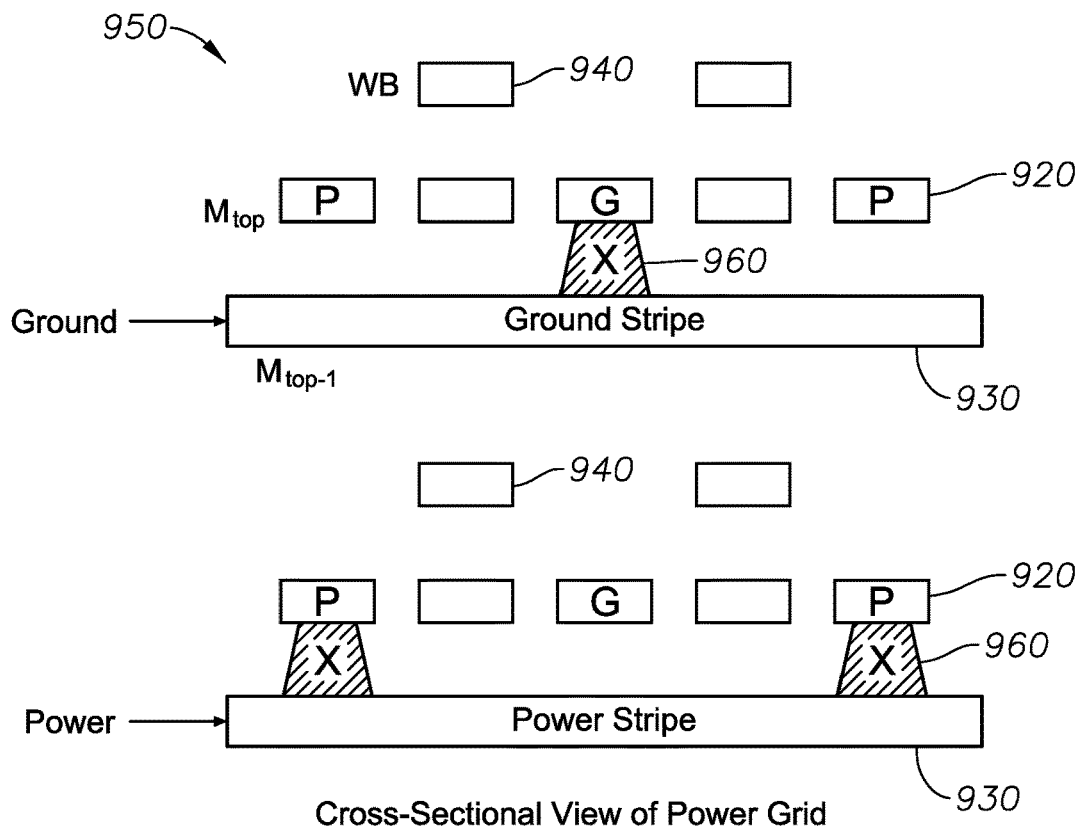

Referring to FIGS. 9A-9B, a top view 900 (FIG. 9A) and a cross-sectional view 950 (FIG. 9B) of a power grid of a semiconductor die (of the example integrated circuit 200) is shown before the coupling/assignment of inter-tier connections to any nets, according to an example implementation. As illustrated, the power grid includes first and second layers 920 (Mtop), 930 (Mtop-1) (e.g., first and second metal stripes, power (P) and ground (G) stripes) and inter-tier connections (e.g., wafer bonds (WB)) 940 prior to coupling and assignment to power or ground. In an example implementation, the inter-tier connections 940 can be wafer bonds, while the first and second layers 920, 930 may be respective first and second top metal layers of the local power grid in a single tier (e.g., single die). In addition, the first top metal layer 920 include one or more vertical stripes (Mtop) and the second top metal layer 930 includes one or more horizontal stripes (Mtop-1).

Figure 10B:
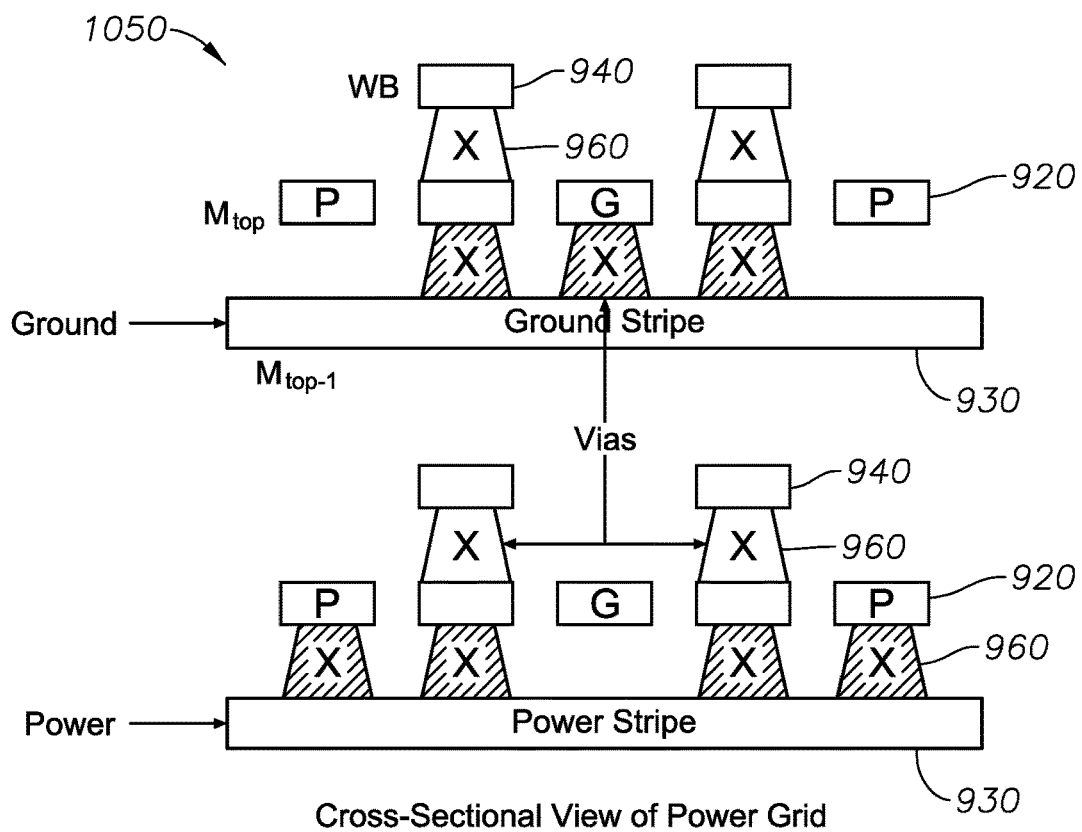

Advantageously, alignment of the of the first layer 920 with the inter-tier connection 940 allows for greater ease in in the coupling and assignment of unused inter-tier connections 940 to power or ground nets across multiple tiers. For instance, in one implementation, it may be assumed that inter-tier connections for signal networks have already been assigned. Hence, the inter-tier connections 940 are spare (unused/unassigned inter-tier connections) after signal network coupling has been completed. Accordingly, the PG net may now be coupled to the inter-tier connections 940 by positioning (e.g., "dropping") a via 960 (shown as an "X") between the Mtop-1 net and the inter-tier connection above it (as shown in FIGS. 10A-10B). Thus, referring to FIGS. 10A-10B, a top view 1000 (FIG. 10A) and a cross-sectional view 1050 (FIG. 10B) of the power grid of the semiconductor die (of the example integrated circuit 200) is shown after the coupling/assignment of inter-tier connections to power/ground nets, according to an example implementation. In certain cases, un-assigned inter-tier connections may be identified based on respective inter-tier connections already coupled to the first networks (i.e., power or ground nets) and second networks (i.e., signal nets). Moreover, in such cases, a metal layer (e.g., one or more first or second metal stripes as described with reference to) may be aligned to the one or more inter-tier connections (located on the local power grid) to the identified un-assigned inter-tier connections. Next, the un-assigned inter-tier connections can be post-assigned to the first networks (i.e., power or ground nets) based on the alignment (of the metal layer and the one or more inter-tier connection).

Referring to FIG. 11, a top view 1100 of a power grid of a semiconductor die (of the example integrated circuit 200) is shown where inter-tier connections 1140 are not in alignment, according to an example implementation. As illustrated, the power grid includes first and second layers 1120, 1130 (i.e., first and second metal stripes) (e.g., power (P) and ground (G) stripes) and inter-tier connections (e.g., wafer bonds (WB)) 1140. In certain implementations, when inter-tier connections 1140 are not aligned correctly above a second top metal layer 1130 (e.g., Mtop-1 metal layer), and there is an offset distance between WBs 1140 and the Mtop-1 metal layer 1130, various design techniques may be implemented as described with reference to FIGS. 12-16. Advantageously, such techniques may achieve connectivity of the inter-tier connections 1140 to the power grid.

Referring to FIG. 12, a top view of a power grid of a semiconductor die (of the example integrated circuit 200) is shown according to an example implementation. As illustrated, the power grid includes first and second layers 1220, 1230 (i.e., one or more first metal stripes (i.e., Mtop stripes) and one or more second metal stripes (i.e., Mtop-1 horizontal metal stripes) (e.g., power (P) and ground (G) stripes) and inter-tier connections (e.g., wafer bonds (WB)) 1240. In one example implementation with reference to FIG. 12, to provide alignment, one or more additional Mtop-1 horizontal metal stripes (e.g., second metal stripes) may be added to the second layer 1230 for coupling to the inter-tier connections 1240 (so as to allow for inter-tiers PG net coupling).

Referring to FIG. 13, a top view 1300 of a power grid of a semiconductor die (of the example integrated circuit 200) is shown according to an example implementation. As illustrated, the power grid includes first and second layers 1320, 1330 (i.e., first one or more metal stripes (i.e., Mtop vertical stripes) and second one or more metal stripes (i.e., Mtop-1 horizontal metal stripes) (e.g., power (P) and ground (G) stripes) and inter-tier connections (e.g., wafer bonds (WB)) 1340. In one example implementation with reference to FIG. 13, to provide alignment, one or more additional Mtop-1 metal patches 1332 may be adjoined to the Mtop-1 horizontal metal stripes (second one or more metal stripes 1330) so as to allow coupling to inter-tier connections 1340 for inter-tiers PG net coupling.

Referring to FIG. 14, a top view 1400 of a power grid of a semiconductor die (of the example integrated circuit 200) is shown according to an example implementation. As illustrated, the power grid includes first and second layers 1420, 1430 (i.e., first one or more metal stripes (i.e., Mtop vertical stripes) and second one or more metal stripes (i.e., Mtop-1 horizontal metal stripes) (e.g., power (P) and ground (G) stripes) and inter-tier connections (e.g., wafer bonds (WB)) 1440. In one example implementation with reference to FIG. 14, to provide alignment, one or more additional Mtop metal patches 1422 may be adjoined to the first one or more metal stripes 1420 so as to allow coupling to the inter-tier connections 1440. In doing so, vias may be positioned ("dropped") for connecting inter-tier connections 1440 to the PG nets.

Referring to FIG. 15, a top view of a power grid of a semiconductor die (of the example integrated circuit 200) is shown according to an example implementation. As illustrated, the power grid includes first and second layers 1520, 1530 (i.e., first one or more metal stripes (i.e., Mtop vertical stripes) and second one or more metal stripes (i.e., Mtop-1 horizontal metal stripes) (e.g., power (P) and ground (G) stripes) and inter-tier connections (e.g., wafer bonds (WB)) 1540. In one example implementation with reference to FIG. 15, to provide alignment, a respective Mtop metal patch 1522 may be adjoined to one or more of the Mtop vertical stripes 1520 so as to couple to the inter-tier connections 1540. In doing so, vias can be positioned ("dropped") to connect the WBs (i.e., inter-tier connections 1540) to the PG nets.

Referring to FIG. 16, a top view of a power grid of a semiconductor die (of the example integrated circuit 200) is shown according to an example implementation. As illustrated, the power grid includes first and second layers 1620, 1630 (i.e., first one or more metal stripes (i.e., Mtop stripes) and second one or more metal stripes (i.e., Mtop-1 horizontal metal stripes) (e.g., power (P) and ground (G) stripes) and inter-tier connections (e.g., wafer bonds (WB)) 1640. In one example implementation with reference to FIG. 16, to provide alignment, additional one or more additional Mtop stripes may be added to the second layer 1620 for coupling to the inter-tier connections 1640 (so as to allow for inter-tiers PG net coupling).

Referring to FIG. 17, a flowchart of an example operational method 1700 (i.e., procedure) to automatically optimize a memory compiler is shown. Advantageously, in various implementations, the method 1700 may reduce voltage drop of a 3D IC memory architecture in real-time, maximize inter-tier connections for power delivery networks. The method 1700 may be implemented with reference to circuit implementations as shown in FIGS. 1-16.

At block 1710, the method includes generating a three-dimensional (3D) circuit design of an integrated circuit. For instance, with reference to various implementations as described in FIGS. 1-16, a central processing unit (as shown in FIG. 18) may execute software instructions based on a standard cell placement (i.e., a standard" semiconductor die design; a memory macro design, a floorplan stage, one (local) or more power grid design across multiple tiers) of a 3D-IC design.

At block 1720, the method includes providing respective inter-tier connections for first and second networks concurrently on the generated 3D circuit design. For instance, with reference to various implementations as described in FIGS. 1-16, a central processing unit (as shown in FIG. 18) may execute software instructions to provide inter-tier connections (i.e., 3D inter-tier connection couplings/assignment, wafer bonds (WB)) (e.g., 224, 625) for first and second networks (i.e., power/ground nets or signal nets) (e.g., VDD/VSS or signal nets).

In an implementation, a place-holder (i.e., "dummy", simulated) (e.g., cross-tier) first network to one or more design blocks of the generated 3D design is provided, wherein the provided place-holder first networks comprise either power or ground networks.

Also, according to other aspects of the operational method, an output may be generated based on the concurrent coupling of the respective inter-tier connections. For example, with reference to various implementations as described in FIGS. 1-16, an output (i.e., a generated integrated circuit design) (e.g., a memory architecture, multi-threshold offerings for memory compilers) may be generated based on the concurrent coupling of the respective inter-tier connections. In some implementations, the circuit design tool 1824 (as described with reference to FIG. 18) may allow users to input various criteria corresponding to one or more robustness metrics of the circuit design, where the robustness metrics may include an electrical potential difference (i.e., IR drop), electromigration (EM) target, signal net routing capability.

FIG. 18 illustrates example hardware components in the computer system 1800 that may be used to provide respective inter-tier connections for first and second networks concurrently and to generate an integrated circuit design/memory architecture output. In certain implementations, the example computer system 1800 (e.g., networked computer system and/or server) may include circuit design tool 1824 and execute software based on the procedure as described with reference to the operational method 100 in FIG. 1 and the operational method 1700 in FIG. 17. In certain implementations, the circuit design tool 1824 may be included as a feature of an existing memory compiler software program allowing users to input above-mentioned robustness metrics The circuit design tool 1824 may provide generated computer-aided physical layout designs for memory architecture. The procedure 1800 may be stored as program code as instructions 1817 in the computer readable medium of the storage device 1816 (or alternatively, in memory 1814) that may be executed by the computer 1810, or networked computers 1820, 1830, other networked electronic devices (not shown) or a combination thereof. In certain implementations, each of the computers 1810, 1820, 1830 may be any type of computer, computer system, or other programmable electronic device. Further, each of the computers 1810, 1820, 1830 may be implemented using one or more networked computers, e.g., in a cluster or other distributed computing system.

In certain implementations, the system 1800 may be used with semiconductor integrated circuit (IC) designs that contain all standard cells, all blocks or a mixture of standard cells and blocks. In a particular example implementation, the system 1800 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 1800 may be stored in one or more of memory 1814 or storage devices 1816 of computer 1810 or in networked computers 1820, 1830.

The system 1800 may perform the following functions automatically, with variable user input: generating a three-dimensional (3D) circuit design of an integrated circuit; providing inter-tier connections (coupling and assignment) on the generated 3D circuit design during any of floor-planning stage, a placement stage, a partitioning stage, a clock tree synthesis (CTS) stage, or a routing stage of a physical circuit design procedure; identification of "power-hungry" regions (i.e., whether a region of the circuit design is above a predetermined power utilization threshold); concurrent coupling of inter-tier connections for PG networks and signal networks; identification of un-assigned inter-tier connections; determination of floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 1800 to produce the target results that are required by a designer. In certain implementations, the system 1800 may also provide for the capability to manually perform functions such as: cell region creation, block placement, pad and cell placement (before and after automatic placement), net routing before and after automatic routing and layout editing. Moreover, verification functions included in the system 800 may be used to determine the integrity of a design after, for example, manual editing, design rule checking (DRC) and layout versus schematic comparison (LVS).

In one implementation, the computer 1800 includes a central processing unit (CPU) 1812 having at least one hardware-based processor coupled to a memory 814. The memory 1814 may represent random access memory (RAM) devices of main storage of the computer 1810, supplemental levels of memory (e.g., cache memories, non-volatile or backup memories (e.g., programmable or flash memories)), read-only memories, or combinations thereof. In addition to the memory 1814, the computer system 1800 may include other memory located elsewhere in the computer 1810, such as cache memory in the CPU 1812, as well as any storage capacity used as a virtual memory (e.g., as stored on a storage device 1816 or on another computer coupled to the computer 1810).

The computer 1810 may further be configured to communicate information externally. To interface with a user or operator (e.g., a circuit design engineer), the computer 1810 may include a user interface (I/F) 1818 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1810 may include a network interface (I/F) 1815 which may be coupled to one or more networks 1840 (e.g., a wireless network) to enable communication of information with other computers and electronic devices. The computer 1860 may include analog and/or digital interfaces between the CPU 1812 and each of the components 1814, 1815, 1816, and 1818. Further, other non-limiting hardware environments may be used within the context of example implementations.

The computer 1810 may operate under the control of an operating system 1826 and may execute or otherwise rely upon various computer software applications, components, programs, objects, modules, data structures, etc. (such as the programs associated with the operational procedures 1000 and 1700 and related software). The operating system 1828 may be stored in the memory 1814. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 1828 in the example of FIG. 18 is shown in the memory 1814, but components of the aforementioned software may also, or in addition, be stored at non-volatile memory (e.g., on storage device 1816 (data storage) and/or the non-volatile memory (not shown). Moreover, various applications, components, programs, objects, modules, etc. may also execute on one or more processors in another computer coupled to the computer 1810 via the network 1840 (e.g., in a distributed or client-server computing environment) where the processing to implement the functions of a computer program may be allocated to multiple computers 1820, 1830 over the network 1840.

In example implementations, circuit macro diagrams have been provided in FIGS. 1-18, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-18 may illustrate systems, apparatuses, or methods according to the teachings of the disclosure, the disclosure is not limited to these illustrated systems, apparatuses, or methods. One or more functions or components of any of FIGS. 1-18 as illustrated or described herein may be combined with one or more other portions of another of FIGS. 1-18. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 1814, the storage device 1816, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method comprising:
generating a three-dimensional (3D) circuit design of an integrated circuit; and
providing respective concurrent assignments and concurrent coupling for inter-tier connections corresponding to first and second networks on the generated 3D circuit design.

2. The method of claim 1, wherein the first networks comprises power or ground networks, and wherein second networks comprise signal networks.

3. The method of claim 1, wherein each of the respective inter-tier connections comprise: couplings of power or ground networks to a location on the generated 3D circuit design.

4. The method of claim 1, further comprising:
providing place-holder first networks to one or more design blocks of the generated 3D design, wherein the provided place-holder first networks comprise either power or ground networks.

5. The method of claim 4, wherein the provided place-holder first networks are configured based on one or more metrics, and wherein the one or more metrics comprise power consumption, electrical potential difference, timing criticality of cross-tier networks, or utilization rate.

6. The method of claim 5, wherein a quantity and locations of the provided place-holder first networks are based on the one or more metrics.

7. The method of claim 4, wherein a priority of the place-holder first networks and the second networks are based on the one or more metrics, wherein the priority corresponds to an assigned cost of the first and second networks coupled to the inter-tier connections.

8. The method of claim 1, wherein the coupling of the respective inter-tier connections comprise: pre-coupling inter-tier connections to power and ground nets during a pre-routing stage or post-coupling inter-tier connections to the power and ground nets during a post-routing stage, wherein a pre-routing stage comprises a stage before signal routing and a post-routing stage comprises a stage after the signal routing, and wherein the signal routing corresponds to an assignment of the inter-tier connections for signal networks.

9. The method of claim 8, wherein un-assigned inter-tier connections are post-assigned to the power and ground nets of the 3D circuit design.

10. The method of claim 8, wherein the pre-assigning of the respective inter-tier connections comprises: pre-assigning the inter-tier connections to the power and ground nets in locations adjacent to or within the region of the 3D circuit design that is above the power utilization threshold.

11. The method of claim 10, wherein a greater density of the inter-tier connections are pre-assigned to the power and ground nets.

12. The method of claim 1, further comprising:
identifying un-assigned inter-tier connections based on the respective inter-tier connections coupled to the first and second networks, wherein the first networks comprises power or ground networks, and wherein second networks comprise signal networks.

13. The method of claim 12, further comprising:
aligning a metal layer with the one or more inter-tier connections to the identified un-assigned inter-tier connections; and
post-assigning the un-assigned inter-tier connections to the first networks based on the alignment.

14. The method of claim 13, further comprising:
adjoining one or more additional metal layers or metal patches to the one or more inter-tier connections to couple the inter-tier connections to the first networks; and
providing respective vias into the inter-tier connections to electrically couple the inter-tier connections to the first networks.

15. The method of claim 1, wherein the coupling of the respective inter-tier connections is performed at one of a floor-planning stage, a placement stage, a partitioning stage, a clock tree synthesis (CTS) stage, or a routing stage of a physical circuit design procedure.

16. The method of claim 1, wherein the respective assignments for the inter-tier connections are provided concurrently based on one or more robustness metrics of the 3D circuit design, and wherein the robustness metrics comprise one or more of an electrical potential difference, electromigration target, and signal net routing capability.

17. The method of claim 1, further comprising:
generating an output based on the concurrent assignment of the respective inter-tier connections.

18. The method of claim 1, further comprising:
providing the output to an integrated circuit design tool.

19. An apparatus comprising:
a computer-readable storage medium;
at least one processor; and
program code stored on the computer-readable storage medium and configured upon execution by the at least one processor to:
generate a three-dimensional circuit design of an integrated circuit; and
provide respective concurrent assignments and concurrent coupling inter-tier connections corresponding to first and second networks on the generated 3D circuit design.

20. A method comprising:
generating a three-dimensional (3D) circuit design of an integrated circuit; and
providing concurrent assignments and concurrent coupling for inter-tier connections on the generated 3D circuit design during one of a placement stage, a partitioning stage, a clock tree synthesis (CTS) stage, or a routing stage of a physical circuit design procedure.

* * * * *